United States Patent [19]
Harada et al.

[11] Patent Number: 5,670,813
[45] Date of Patent: Sep. 23, 1997

[54] PROTECTION CIRCUIT FOR ELECTRONIC COMPONENTS EMPLOYING BIPOLAR TRANSISTORS

[75] Inventors: Kouichi Harada; Tetsuya Iizuka; Hiroshi Hibi, all of Kanagawa, Japan

[73] Assignee: Sony Corporation, Japan

[21] Appl. No.: 540,074

[22] Filed: Oct. 6, 1995

[30] Foreign Application Priority Data

Oct. 12, 1994 [JP] Japan ................. 6-246482

[51] Int. Cl.$^6$ ................. H01L 29/06; H01L 29/78
[52] U.S. Cl. ................. 257/355; 257/215; 257/361; 257/565
[58] Field of Search ................. 257/215, 256, 257/355, 356, 357, 361, 362, 280

[56] References Cited

U.S. PATENT DOCUMENTS 5,373,179  12/1994  Matsui et al. ................. 257/355

FOREIGN PATENT DOCUMENTS 6-77406  3/1994  Japan .

*Primary Examiner*—Tom Thomas
*Assistant Examiner*—David B. Hardy
*Attorney, Agent, or Firm*—Ronald P. Kananen

[57] ABSTRACT

In a semiconductor device such as a CCD solid-state imager having terminals connected with protection transistors, a strength against a static electricity applied between a terminal and a ground (GND) and a strength against a static electricity applied between a terminal and a substrate and a strength against a static electricity between terminals can be improved.

18 Claims, 12 Drawing Sheets

PROTECTION CIRCUIT FOR ELECTRONIC COMPONENTS EMPLOYING BIPOLAR TRANSISTORS

BACKGROUND OF THE INVENTION

The present invention relates to a semiconductor integrated circuits such as semiconductor device, e.g., CCD (charge-coupled device) solid-state imager with terminals to which a ground voltage (GND), a positive voltage and a negative voltage are applied, respectively, and having protection elements connected to respective terminals, and particularly to a protection circuit for a CCD solid-state imager.

In a CCD solid-state imager, a positive voltage such as a ground voltage (GND) or voltage ($V_{DD}$) applied to a positive power-supply terminal and a negative voltage such as a vertical transfer clock pulse are existing in a mixed state. Protection elements formed of bipolar transistors for protecting respective portions of the solid-state imager are connected to the terminals to which respective voltages are applied. A protection element is connected to a terminal of a vertical transfer register, for example, in order to protect a gate insulating film formed under the transfer electrode from being destroyed when a static electricity is applied to the terminal. Similarly, a protection element is connected to a reset drain terminal in order to prevent a reset drain junction from being destroyed by a static electricity. Furthermore, protection elements are connected to a reset gate terminal, a terminal of a horizontal transfer register, a horizontal output gate terminal and a terminal of an output MOS (metal oxide semiconductor) transistor constructing an output circuit, respectively.

FIG. 1 of the accompanying drawings shows an example of a protection circuit in a CCD solid-state imager.

A protection circuit, generally denoted at reference numeral at 1 in FIG. 1, comprises terminals $T_1$, $T_2$, $T_3$ and a protected portion $L_1$ (e.g., a gate of a vertical transfer register) connected to the terminal $T_1$, a protected portion $L_2$ (e.g., output MOS transistor)) connected to the terminal $T_2$ and a protected portion $L_3$ (e.g., a reset drain) connected to the terminal $T_3$.

When this protection circuit 1 is operated, a vertical transfer clock pulse $\phi V$ composed of three-value pulses of $-9V$, $15V$ and $0V$ is applied to the terminal $T_1$. A source voltage of $10V$ is applied to the terminal $T_2$ and a power supply voltage $V_{DD}$, e.g., a reset drain voltage is applied to the terminal $T_3$.

In order to protect the protected portions $L_1$, $L_2$, $L_3$, npn bipolar protection transistors $Q_1$, $Q_2$, $Q_3$ are connected to the corresponding terminals $T_1$, $T_2$, $T_3$, respectively. The npn bipolar protection transistors $Q_1$, $Q_2$, $Q_3$ are formed on a common n-type semiconductor substrate wherein the CCD solid-state imager is formed. The collectors of the npn bipolar protection transistors $Q_1$, $Q_2$, $Q_3$ are composed of the common n-type semiconductor substrate, the emitters thereof are connected to the corresponding terminals $T_1$, $T_2$, $T_3$, and the bases thereof are connected in common. A minimum voltage $V_L$ (e.g., $-12V$) used within the protection circuit 1 is supplied to the bases connected in common and a substrate voltage $V_{sub}$ (e.g., $10V$) is supplied to the collectors connected in common.

The protection transistors $Q_1$, $Q_2$, $Q_3$ are composed of transistors with an equal breakdown voltage, i.e., an equal base-emitter withstand voltage against reverse current. Since a power supply voltage $V_{DD}$ is $15V$, transistors with a breakdown voltage of $15V-(-12V)=27V$ or greater are used as the protection transistors $Q_1$, $Q_2$, $Q_3$.

In the protection circuit 1 shown in FIG. 1, when a positive static electricity is applied to the terminal $T_1$, for example, before the CCD is assembled into the set, as shown in FIG. 2, an emitter-base junction of the protection transistor $Q_1$ is broken down so that a current $a_1$ flows from the terminal $T_1$ through the emitter-base path of the protection transistor $Q_1$ and a current $a_2$ flows from the terminal $T_1$ through the emitter-collector path of the protection transistor $Q_1$ to the substrate side, thereby preventing the protected portion $L_1$ from being destroyed.

When a negative static electricity is applied to the terminal $T_1$, a forward voltage is applied to the emitter-base path of the protection transistor $Q_1$ so that the protection transistor $Q_1$ is turned on, i.e., a current $b_1$ flows from the base to the emitter of the protection transistor $Q_1$, whereby a current $b_2$ flows from the substrate side through the collector-emitter path of the protection transistor $Q_1$ to the terminal $T_1$, thereby preventing the protected portion $L_1$ from being destroyed.

Even when a static electricity is applied between the terminals, the protected portion can be protected from being destroyed. If a positive electricity is applied to the terminal $T_2$ between the terminals $T_1$ and $T_2$, as shown in FIG. 3A, then the base-emitter junction of the protection transistor $Q_2$ is broken down and a base potential of the protection transistor $Q_1$ whose base is connected to the protection transistor $Q_2$ in common is increased so that the protection transistor $Q_1$ is turned on, allowing a current $a_3$ to flow. Therefore, as shown in FIG. 3B, a current $a_4$ flows from the terminal $T_2$ through the emitter-collector path of the protection transistor $Q_2$ to the substrate side, thereby protecting the protected portion from being destroyed.

When a negative static electricity is applied to the terminal $T_2$ between the terminals $T_1$ and $T_2$, as shown in FIG. 4A, then a forward voltage is applied to the emitter-base path of the protection transistor $Q_2$ and the protection transistor $Q_2$ is turned on. As a consequence, the base potential of the protection transistor $Q_1$ whose base is connected to the protection transistor $Q_2$ in common is lowered and the emitter-base junction of the protection transistor $Q_1$ is broken down to allow a current $b_3$ to flow. Therefore, as shown in FIG. 4B, a current $b_4$ flows from the substrate side through the collector-emitter path of the protection transistor $Q_2$ to the terminal $T_2$, thereby protecting the protected portion from being destroyed.

In the protection circuit 1 shown in FIG. 1, since the protected portions $L_1$, $L_2$, $L_3$ are protected by the protection transistors $Q_1$, $Q_2$, $Q_3$ with the same breakdown voltage, i.e., same base-emitter withstand voltage against the reverse current regardless of a difference of the withstand voltages and a difference of the operation voltages of the protected portions $L_1$, $L_2$, $L_3$, an electrostatic strength at the terminal $T_3$ with the power supply voltage $V_{DD}$ applied thereto, i.e., a strength against an static electricity of the protected portion $L_3$ connected to the terminal $T_3$ is degraded.

In the protection circuit 1 shown in FIG. 1, there is proposed a protection circuit wherein breakdown voltages of the protection transistors $Q_1$, $Q_2$, $Q_3$ are varied in response to the withstand voltages and the operation voltages of the protected portions $L_1$, $L_2$, $L_3$ (see Japanese laid-open patent publication No. 6-77406 and corresponding U.S. Pat. No. 5,373,179).

FIG. 5 shows another example of a protection circuit. As shown in FIG. 5, in a protection circuit 2, with respect to terminals where protected portions have a relatively weak strength against a static electricity and a voltage used does not become negative, e.g., terminals $T_2$, $T_3$ like terminals of the output section, the bases of protection transistors $Q_2$, $Q_3$ are connected to the ground (GND) terminals, and a minimum voltage $V_L$ (e.g., $-12V$) used within the protection circuit 2 is applied to the base of a protection transistor $Q_1$ connected to a terminal where a used voltage becomes negative, e.g., terminal $T_1$.

In the protection circuit 2, since the ground voltage GND is applied to both bases of the protection transistors $Q_2$, $Q_3$ connected to the terminals $T_2$, $T_3$, the base-emitter withstand voltages of the protection transistors $Q_2$, $Q_3$ against the reverse current can be lowered, thereby improving a strength of the protected portions against a static electricity.

However, in the protection circuit 2 shown in FIG. 5, although a strength of the transistors $Q_2$, $Q_3$ whose bases are connected to the ground (GND) against a static electricity is improved between the terminals $T_2$ and $T_3$, a strength against a static electricity applied to the terminal $T_2$ or $T_3$ of the transistor $Q_2$ or $Q_3$ whose base is connected to the ground (GND) or the terminal $T_1$ of the transistor $Q_1$ whose base is not connected to the ground (GND) is deteriorated as compared with that of the protection circuit 1 shown in FIG. 1. Specifically, when a static electricity is applied between the terminals and $T_2$ or $T_3$, the bases of the transistors $Q_1$, $Q_2$, $Q_3$ are not connected in common so that a current path is not formed, resulting in the strength against the static electricity being deteriorated.

SUMMARY OF THE INVENTION

In view of the aforesaid aspect, it is an object of the present invention to provide a semiconductor device having protection transistors connected to terminals thereof wherein a strength of the terminals against a static electricity applied between the terminals and the ground and a strength against a static electricity applied between the terminals can be improved.

According to a first aspect of the present invention, there is provided an electric circuit which is comprised of a first electrical element operating within a first voltage area and having a first breakdown voltage, a second electrical element operating within a second voltage area and having a second breakdown voltage, a first terminal connected to the first electrical element, a second terminal connected to the second electrical element, a first protection circuit connected to the first and second terminals wherein the first protection circuit comprises a first bipolar transistor whose emitter is connected to the first terminal and a second bipolar transistor whose emitter is connected to the second terminal, and wherein bases of the first and second bipolar transistors are connected in common, and a second protection circuit connected to one of the first and second terminals, wherein the second protection circuit comprises a third bipolar transistor whose emitter is connected to one of the first and second terminals, and wherein a base of the third bipolar transistor is electrically isolated from the bases of the first and second bipolar transistors.

According to a second aspect of the present invention, there is provided an electric circuit which is comprised of a plurality of electrical elements, a plurality of terminals associated with the plurality of electrical elements, the plurality of terminals supplied with operating voltages, a protection circuit for protecting the plurality of terminals, the protection circuit comprising a plurality of first bipolar transistors connected between the plurality of terminals and a first voltage in cascade, bases of the plurality of first bipolar transistors connected in common and supplied with a second voltage, and a second bipolar transistor connected between one of the plurality of terminals and a third voltage, a base of the second bipolar transistor supplied with a fourth voltage different from the second voltage.

According to a third aspect of the present invention, there is provided a charge-coupled device which is comprised of a plurality of electrical elements, a plurality of terminals associated to the plurality of electrical elements, the plurality of terminals supplied with operating voltages, respectively, a first protection circuit connected to the plurality of terminals for protecting the plurality of electrical elements, the first protection circuit comprising a plurality of first bipolar transistors connected between the plurality of terminals and a first voltage in cascade, bases of the plurality of first bipolar transistors connected in common and supplied with a second voltage, and a second protection circuit connected to a part of the plurality of terminals for protecting the part of the plurality of electrical elements, the second protection circuit comprising at least a second bipolar transistor connected between the part of the plurality of terminals and a third voltage, a base of the second bipolar transistor supplied with a fourth voltage different from the second voltage.

In accordance with a fourth aspect of the present invention, there is provided a solid-state imager which is comprised of a vertical transfer section for transferring signal charges in a vertical direction, the vertical transfer section including a plurality of closely spaced transfer gate electrodes, a horizontal transfer section for receiving the signal charges transferred from the vertical transfer section and for transferring the signal charges in a horizontal direction, an output diffusion region for receiving the signal charges transferred from the horizontal transfer section and accumulating the signal charges therein, an output circuit electrically connected to the output diffusion region and outputting a voltage signal corresponding to the signal charges to an output terminal, a plurality of terminals associated with the transfer gate electrodes of the vertical transfer section and the output circuit, the plurality of terminals supplied with operating voltages, respectively, a first protection circuit connected to the plurality of terminals for protecting the vertical transfer section and the output circuit, the first protection circuit comprising a plurality of first bipolar transistors connected between the plurality of terminals and a first voltage in cascade, bases of the plurality of first bipolar transistors connected in common and supplied with a second voltage, and a second protection circuit connected to a part of the plurality of terminals except a terminal associated with the transfer gate electrodes for protecting the output circuit, the second protection circuit comprising at least a second bipolar transistor connected between the part of the plurality of terminals and a third voltage, a base of the second bipolar transistor supplied with a fourth voltage different from the second voltage.

DETAILED DESCRIPTION OF THE PREFERRED EMBODIMENT

The present invention will now be described with reference to the drawings.

Figure 6:
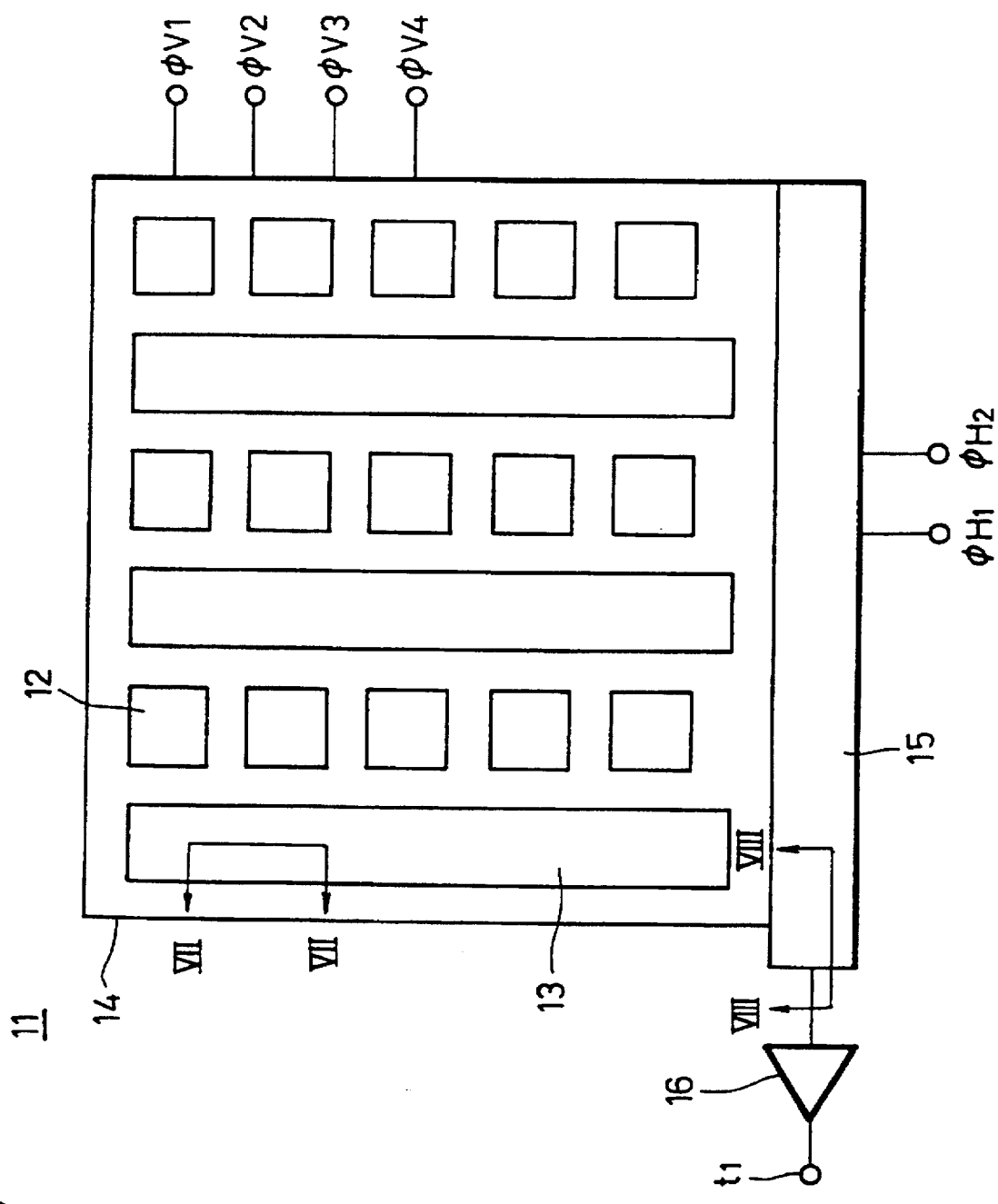
FIG. 6 is a plan view showing an example of a CCD solid-state imager to which the present invention is applied.

FIG. 6 shows an interline transfer system CCD solid-state imager to which the present invention is applied.

A CCD solid-state imager, generally depicted at reference numeral 11 in FIG. 6, comprises an imager region 14 composed of a plurality of light-receiving portions 12, each forming a pixel, arranged in a matrix fashion and vertical transfer registers 13, each having a CCD structure, arranged on one side of the columns of the light-receiving portions 12, a horizontal transfer register 15 having a CCD structure connected with the ending stages of the vertical transfer registers 13 and an output circuit, i.e., output amplifier 16 connected to the output side of the horizontal transfer register 15.

Figure 7:
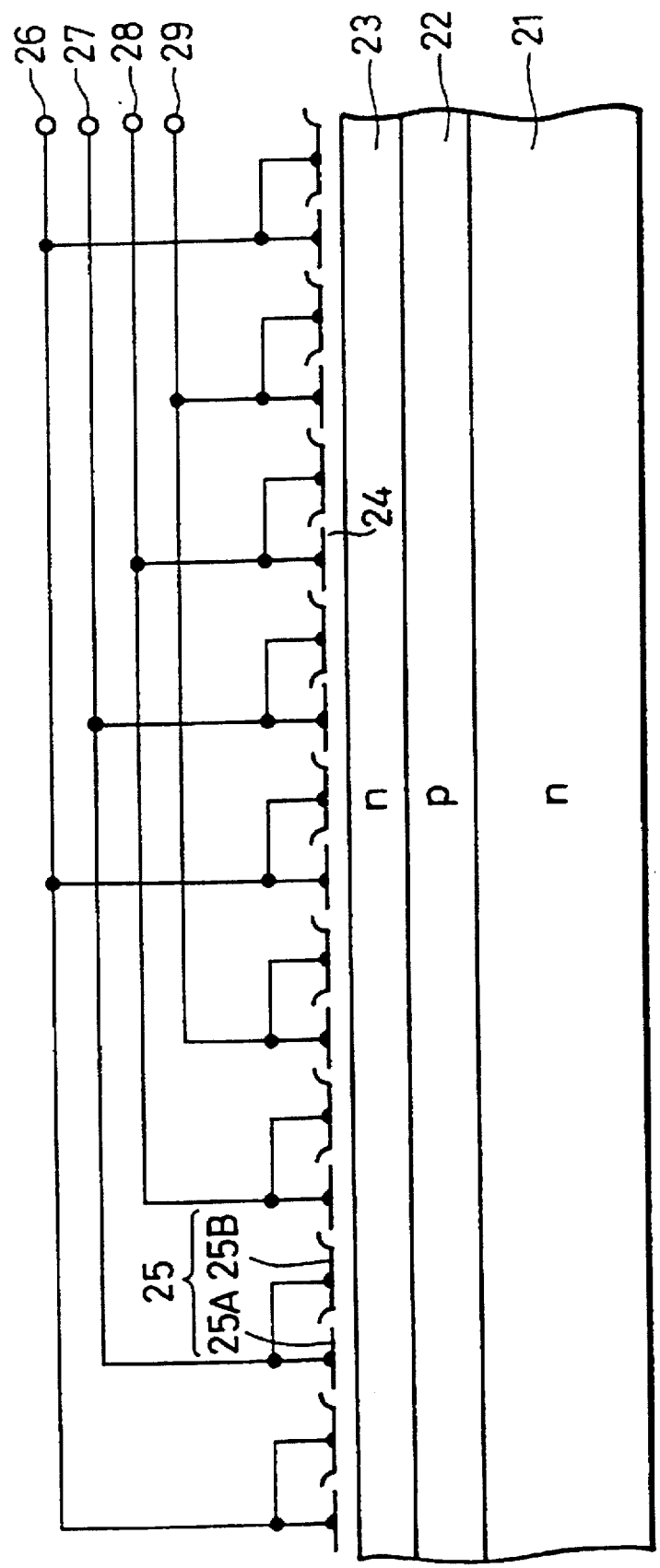
FIG. 7 is a cross-sectional view taken along the line VII—VII in FIG. 6.

As shown in FIG. 7, the vertical transfer register 13 comprises a first conductivity type, e.g., n-type silicon semiconductor substrate 21, a second conductivity type, e.g., p-type well region 22 formed on the n-type silicon semiconductor substrate 21, a n-type transfer channel 23 formed on the p-type well region 22, and a plurality of first transfer electrodes 25A made of a polycrystalline silicon first layer and second transfer electrodes 25B made of a polycrystalline silicon second layer alternately formed along the transfer direction through a gate insulating film 24 such as SiO$_2$. In the vertical transfer register 13, adjacent two transfer electrodes 25A, 25B connected in common are paired to form a transfer electrode 25 and three sets of the transfer electrodes 25 [25A, 25B] are connected in common. Four-phase vertical drive pulses (e.g., three-value pulses of −9V, 0V, 15V) $\phi V_1$, $\phi V_2$, $\phi V_3$, $\phi V_4$ are applied to terminals 26, 27, 28, 29 of the transfer electrodes 25, respectively.

Figure 8:
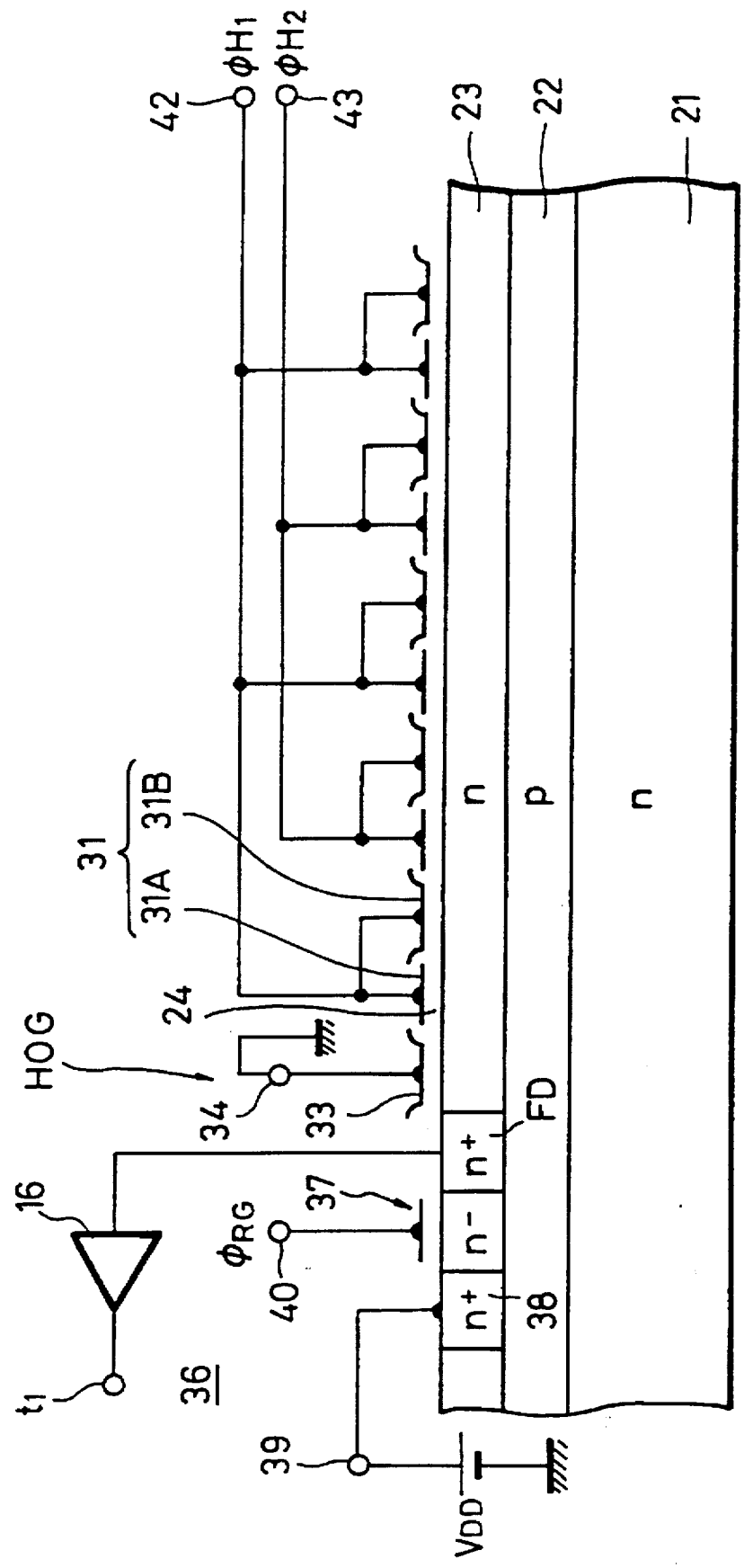
FIG. 8 is a cross-sectional view taken along the line VIII—VIII in FIG. 6.

As shown in FIG. 8, the horizontal transfer register 15 includes a plurality of first transfer electrodes 31A made of a polycrystalline silicon first layer and second transfer electrodes 31B made of a polycrystalline silicon second layer arranged alternately in the transfer direction through the gate insulating film 24 such as SiO$_2$. In this horizontal transfer register 15, adjacent two transfer electrodes 31A and 31B connected in common are paired to form a transfer electrode 31. Two-phase horizontal drive pulses (e.g., two-value pulses of 5V and 0V) $\phi H_1$, $\phi H_2$ are applied through terminals 42, 43 to every other transfer electrodes 31 [31A, 31B] and another every other transfer electrodes 31 [31A, 31B], respectively. In FIG. 8, like elements and parts corresponding to those of FIG. 7 are marked with the same references and therefore need not be described in detail.

As shown in FIG. 8, a horizontal output gate section HOG composed of a gate electrode 33 made of a polycrystalline silicon second layer is formed behind the transfer section of the final stage of the horizontal transfer register 15 through the gate insulating film 24. A fixed output gate voltage, e.g., ground voltage (GND) is applied through a terminal 34 to the horizontal output gate section HOG. A charge detection section 36 is formed on the succeeding stage of the horizontal output gate section HOG. The charge detection section 36 comprises a floating diffusion region FD formed of a n-type semiconductor region adjacent to the horizontal output gate section HOG for accumulating signal charges, a reset gate section 37 disposed adjacent to the floating diffusion region FD for resetting signal charges accumulated in the floating diffusion region FD, a reset drain region 38 and an output circuit (i.e., output amplifier) 16 for detecting signal charges accumulated in the floating diffusion region FD. In FIG. 8, reference symbol $t_1$ denotes an output terminal.

Figure 9:
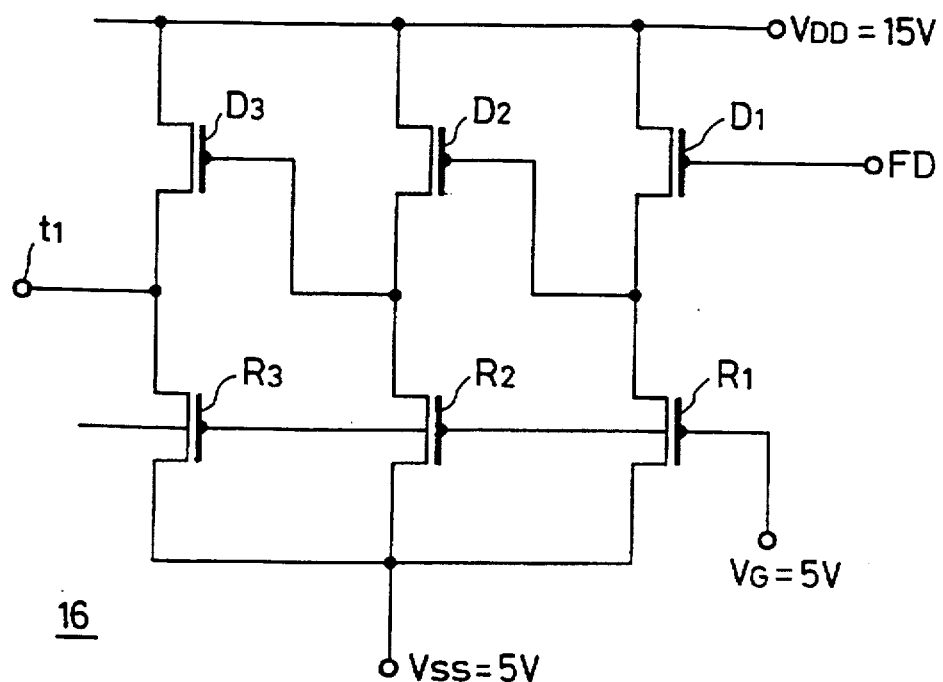
FIG. 9 is a diagram showing an example of an output circuit concretely.

FIG. 9 shows the output amplifier 16 concretely.

As shown in FIG. 9, the output amplifier 16 is of a three-stage source-follower circuit which comprises drive transistors $D_1$, $D_2$, $D_3$ and load transistors $R_1$, $R_2$, $R_3$. Drains of the drive transistors $D_1$, $D_2$, $D_3$ are connected to a positive power-supply terminal to which a voltage $V_{DD}$ of 15V is applied. Gate electrodes and sources of the load transistors $R_1$, $R_2$, $R_3$ are connected to a positive power-supply terminal to which a voltage $V_{SS}$ of 5V, for example is applied. The gate electrode of the transistor $D_1$ is connected to the floating diffusion region FD. Then, the output terminal $t_1$ is led out from the source of the drive transistor $D_3$.

Referring back to FIG. 8, the reset drain region 38 is formed of a n-type semiconductor layer. A reset voltage, e.g., power supply voltage $V_{DD}$ is applied through a terminal 39 to the reset drain region 38. A reset pulse $\phi_{RG}$ is applied to the reset gate section 37 through a terminal 40. Although not shown, a voltage of 10V, for example, is applied through a terminal to a source of an output MOS transistor constructing the output circuit 16, the power supply voltage $V_{DD}$ is applied to the drain of the output MOS transistor and a predetermined voltage is applied through a terminal to the gate of the output MOS transistor.

In this CCD solid-state imager 11, signal charges photoelectrically-converted by the light-receiving sections 12 in response to an intensity of received light are read out to the vertical transfer register 13. The signal charges read out to the vertical transfer register 13 are transferred through the vertical transfer register 13 to the horizontal transfer register 15. The signal charges transferred to the horizontal transfer register 15 are transferred to the floating diffusion region FD at every pixel and converted by the output circuit 16 in the form of charge to voltage, whereafter they are read out from the output terminal $t_1$ as a CCD output. When the reset pulse $\phi_{RG}$ is applied to the reset gate section 37 after a signal charge of one pixel has been read out, signal charges in the floating diffusion region FD are discharged through the reset gate section 37 to the reset drain region 38, whereby the potential of the floating diffusion region FD is reset to the potential of the reset drain region 38.

Figure 10:
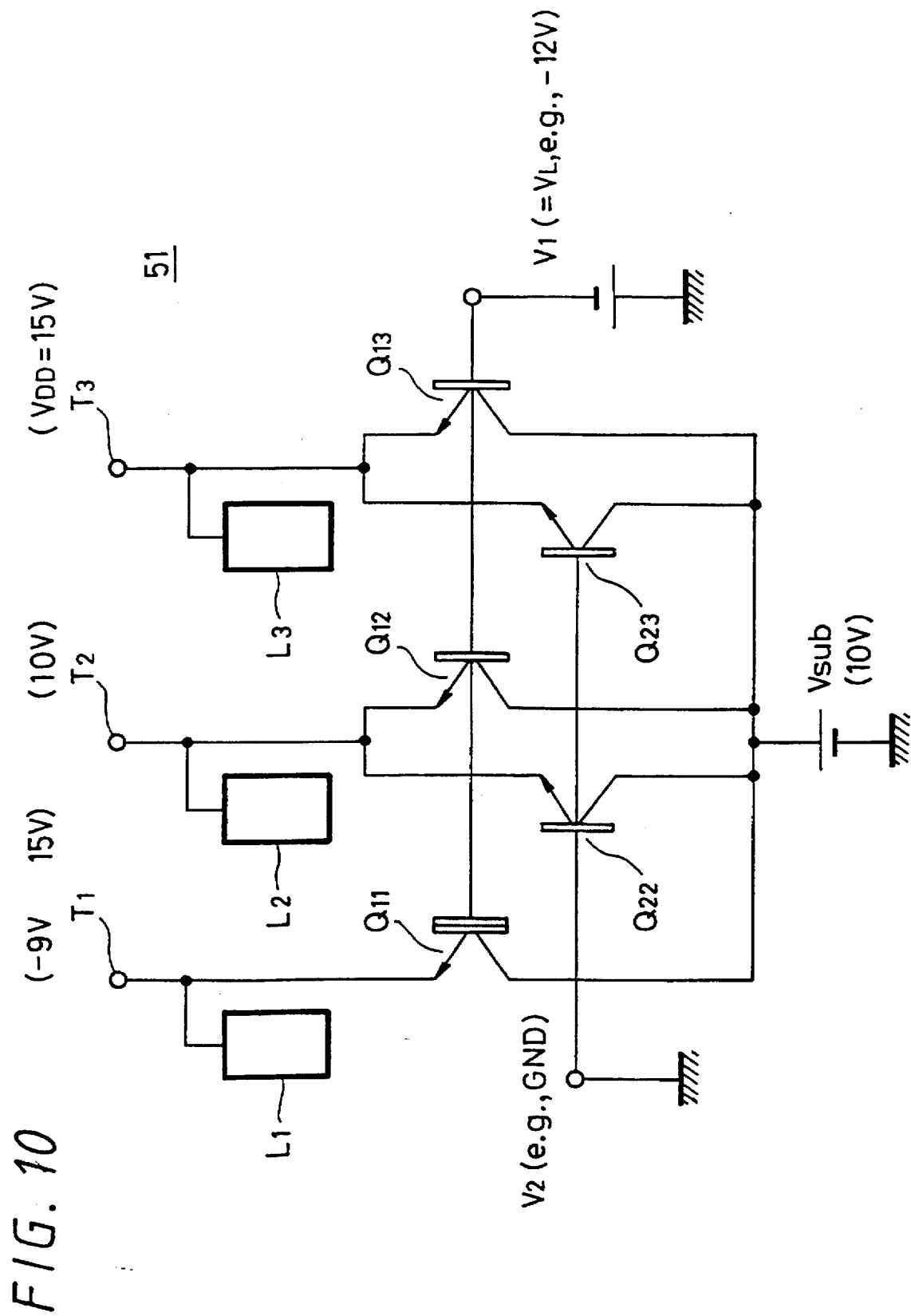
FIG. 10 is a diagram showing a protection circuit according to the present invention.

According to this embodiment, FIG. 10 shows a protection circuit 51 wherein protection transistors are connected to the terminals 26, 27, 28, 29, 34, 39, 40, 42, 43 of the CCD solid-state imager and the terminals of the output MOS transistor in the output circuit 16.

FIG. 10 typically shows three terminals of the above-mentioned terminals. As shown in FIG. 10, a vertical transfer register has a terminal $T_1$, an output MOS transistor in the output circuit has a terminal $T_2$, and a reset drain has a terminal $T_3$. A protected portion $L_1$ (e.g., gate of vertical transfer register) is connected to the terminal $T_1$, a protected portion $L_2$ (e.g., source of the drive transistor $D_3$ and gate electrodes or sources of the load transistors $R_1$, $R_2$, $R_3$) is connected to the terminal $T_2$, and a protected portion $L_3$ (e.g., reset drain 38 and the drains of the drive transistors $D_1$, $D_2$, $D_3$) is connected to the terminal $T_3$. Accordingly, when this protection circuit 51 is operated, the vertical transfer clock pulse $\phi V$ composed of the three-value pulses of $-9V$, $0V$, $15V$, for example, is applied to the terminal $T_1$, a source voltage of $10V$, for example, is applied to the terminal $T_2$ and the reset drain voltage, e.g., power-supply voltage $V_{DD}$ is applied to the terminal $T_3$.

As shown in FIG. 10, the protection circuit 51 according to the present invention includes npn bipolar protection transistors $Q_{11}$, $Q_{12}$, $Q_{13}$ of a first group connected to all terminals $T_1$, $T_2$, $T_3$, and npn bipolar protection transistors $Q_{22}$, $Q_{23}$ of a second group connected in parallel to the protection transistors $Q_{12}$, $Q_{13}$ to the terminals $T_2$, $T_3$ whereat a used minimum potential never becomes negative except the terminal $T_1$ whereat a used minimum potential becomes negative. A terminal at which the minimum potential is the ground potential GND is treated as a terminal at which a used minimum potential becomes negative because a protection transistor is turned on if 0V is fluctuated in the horizontal transfer register, for example.

The protection transistors $Q_{11}$, $Q_{12}$, $Q_{13}$, $Q_{22}$, $Q_{23}$ use a common n-type semiconductor substrate with the CCD solid-state imager formed thereon as their collectors and are formed on this n-type semiconductor substrate. The emitters of the protection transistors $Q_{11}$, $Q_{12}$, $Q_{13}$ of the first group are respectively connected to the corresponding terminals $T_1$, $T_2$, $T_3$, and the bases thereof are connected in common and supplied with a predetermined voltage $V_1$ which will be described later on. The collectors of the protection transistors $Q_{11}$, $Q_{12}$, $Q_{13}$ are connected in common and supplied with a substrate voltage $V_{sub}$ (e.g., 10V).

The emitters of the protection transistors $Q_{22}$, $Q_{23}$ of the second group are respectively connected to the corresponding terminals $T_2$, $T_3$. The bases thereof are connected in common and supplied with a predetermined voltage $V_2$ which will be described later on. The collectors of the protection transistors $Q_{22}$, $Q_{23}$ of the second group are connected in common and supplied with the substrate voltage $V_{sub}$.

If the protection transistors are formed of the npn transistors, then the base voltage $V_2$ of the protection transistors $Q_{22}$, $Q_{23}$ of the second group is set to be higher than the base voltage $V_1$ of the protection transistors $Q_{11}$, $Q_{12}$, $Q_{13}$ of the first group ($V_2 > V_1$). The base voltage $V_1$ of the protection transistors $Q_{11}$, $Q_{12}$, $Q_{13}$ of the first group is set to be lower than the minimum potential $V_{A\ min}$ (e.g., $-9V$) applied to the terminal $T_1$, i.e., the minimum voltage $V_L$ (e.g., $-12V$) used in the protection circuit. The base voltage $V_2$ of the protection transistors $Q_{22}$, $Q_{23}$ of the second group is set to be lower than a minimum voltage $V_{B\ min}$ applied to the terminals $T_2$, $T_3$. In this embodiment, the base voltage $V_2$ is set to be the ground potential (GND).

According to this embodiment, the protection transistors $Q_{11}$, $Q_{12}$, $Q_{13}$ and $Q_{22}$, $Q_{23}$ of the first and second groups are arranged such that the absolute value of the base-emitter withstand voltage of the protection transistors $Q_{11}$, $Q_{12}$, $Q_{13}$ of the first group against the reverse current becomes greater than the absolute value of the base-emitter withstand voltage of the protection transistors $Q_{22}$, $Q_{23}$ of the second group against the reverse current.

The protection transistors $Q_{11}$, $Q_{12}$, $Q_{13}$ of the first group and the protection transistors $Q_{22}$, $Q_{23}$ of the second group might be formed of transistors wherein base-emitter withstand voltages against the reverse current are set in response to the withstand voltages and the operation voltages of the protected portions $L_1$, $L_2$ connected to the terminals $T_1$, $T_2$, $T_3$. The base-emitter withstand voltages of the protection transistors $Q_{11}$, $Q_{13}$ against the reverse current, for example, can be set to 27V, a base-emitter withstand voltage of the protection transistor $Q_{12}$ against the reverse current can be set to 22V, a base-emitter withstand voltage of the protection transistor $Q_{22}$ against the reverse current can be set to 10V, and a base-emitter withstand voltage of the protection transistor $Q_{23}$ against the reverse current can be set to 15V, respectively.

An operation of the protection circuit 51 will be described below.

Figure 11:
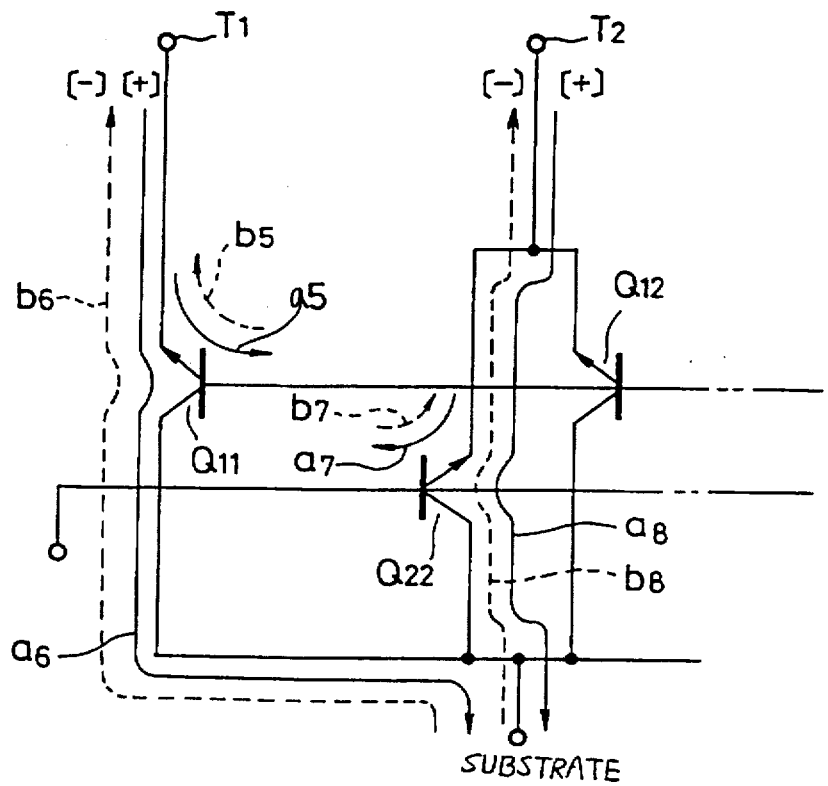
FIG. 11 is a diagram used to explain an operation of the protection circuit shown in FIG. 10.

When a positive static electricity is applied to the terminal $T_1$, for example, before the CCD is assembled into the set, as shown in FIG. 11, the emitter-base junction of the first protection transistor $Q_{11}$ is broken down and a current $a_5$ flows from the terminal $T_1$ through the emitter-base path so that the current $a_6$ flows to the substrate side from the terminal $T_1$ through the emitter-collector path of the protection transistor $Q_{11}$. When a negative static electricity is applied to the terminal $T_1$, a forward voltage is applied to the base-emitter junction of the protection transistor $Q_{11}$ and the protection transistor $Q_{11}$ is turned on, i.e., a current $b_5$ flows from the base to the emitter so that the current $b_6$ flows to the terminal $T_1$ from the substrate side through the collector-emitter path of the protection transistor $Q_{11}$, thereby protecting the protected portion $L_1$ from being destroyed.

When a positive static electricity is applied to the terminal $T_2$, as shown in FIG. 11, the emitter-base junction of the protection transistor $Q_{22}$ of the second group is broken down and a current $a_7$ flows from the terminal $T_2$ through the base-emitter path so that a current as flows to the substrate side from the terminal $T_2$ through the collector-emitter path of the protection transistor $Q_{22}$. When on the other hand a negative static electricity is applied to the terminal $T_2$, the forward voltage is applied to the emitter-base junction of the protection transistor $Q_{22}$ and the transistor $Q_{22}$ is turned on, i.e., a current $b_7$ flows from the base to the emitter so that a current be flows to the terminal $T_2$ from the substrate side through the collector-emitter path of the protection transistor $Q_{22}$, thereby protecting the protected portion $L_2$ from being destroyed.

With respect to the terminal $T_3$, the protection transistor $Q_{23}$ of the second group can protect the protected portion $L_3$ from being destroyed similarly to the terminal $T_2$.

A manner in which the protection circuit is operated when a static electricity is applied between the terminals will be described.

Figure 12B:
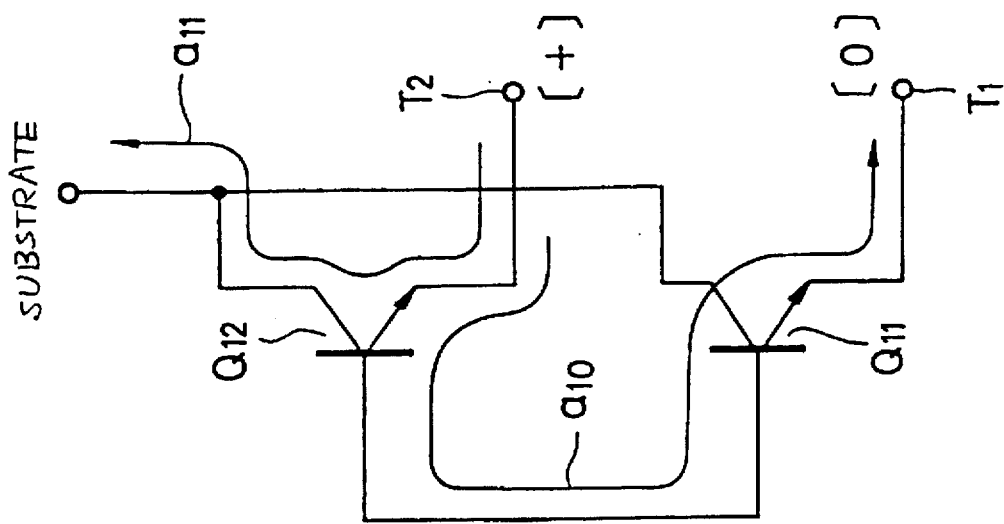
FIGS. 12A, 12B and FIGS. 13A, 13B are diagrams used to explain an operation of the protection circuit shown in FIG. 10.
Figure 12A:
Figure 12A:
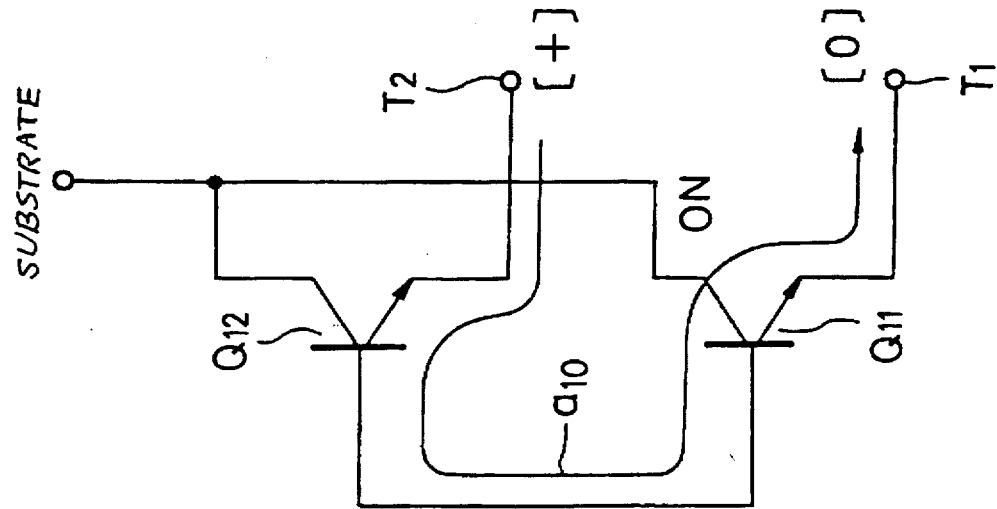

When a positive static electricity is applied between the terminals $T_1$ and $T_2$, for example, such that the terminal $T_2$ is held at a positive potential, as shown in FIG. 12A, the emitter-base junction of the protection transistor $Q_{12}$ is broken down and the base potential of the protection transistor whose base is connected to the base of the protection transistor $Q_{12}$ in common is elevated so that the protection transistor $Q_{11}$ is turned on to cause a current $a_{10}$ to flow. Therefore, as shown in FIG. 12B, a current $a_{11}$ flows to the substrate side from the terminal $T_2$ through the emitter-collector path of the protection transistor $Q_{12}$.

Figure 13B:
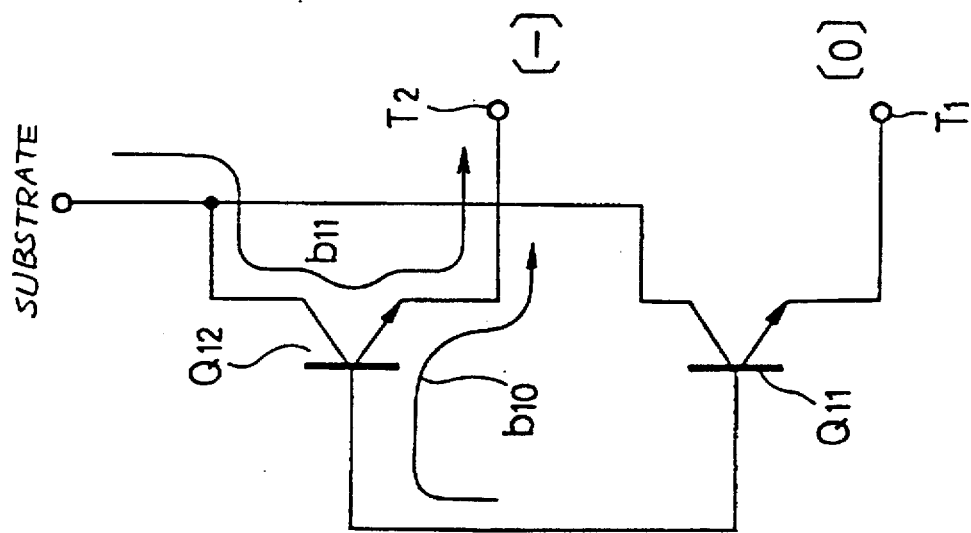
Figure 13A:
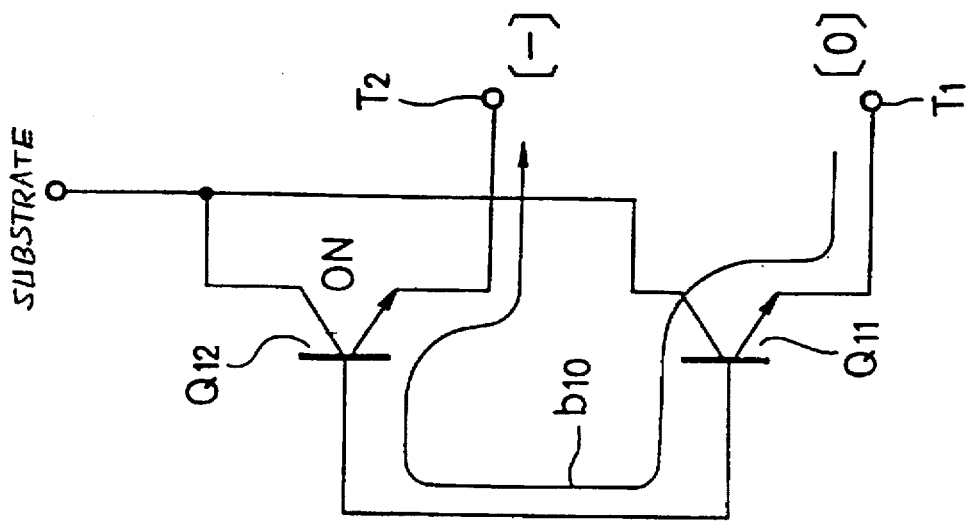

When a negative static electricity is applied between the terminals $T_1$ and $T_2$, for example, such that the terminal $T_2$ is held at a negative potential, as shown in FIG. 13A, a forward voltage is applied to the emitter-base junction of the protection transistor $Q_{12}$ and the protection transistor $Q_{12}$ is turned on so that the base potential of the protection transistor $Q_{11}$ whose base is connected to the base of the protection transistor $Q_{12}$ in common is lowered. Therefore, the emitter-base junction of the protection transistor $Q_{12}$ is broken down and a current $b_{10}$ flows so that, as shown in FIG. 13B, a current $b_{11}$ flows to the terminal $T_2$ from the substrate side through the collector-emitter path of the protection transistor $Q_{12}$, thereby protecting the protected portion from being destroyed.

Since the bases of the protection transistors $Q_{11}$, $Q_{13}$ of the first group are connected in common, when a static electricity is applied between the terminals $T_1$ and $T_3$, the protection transistors $Q_{11}$, $Q_{13}$ are operated with similar effects being achieved.

Furthermore, when a static electricity is applied between the terminals $T_2$ and $T_3$, the protection transistors $Q_{22}$, $Q_{23}$ of the second group are operated with similar effects being achieved.

Figure 1:
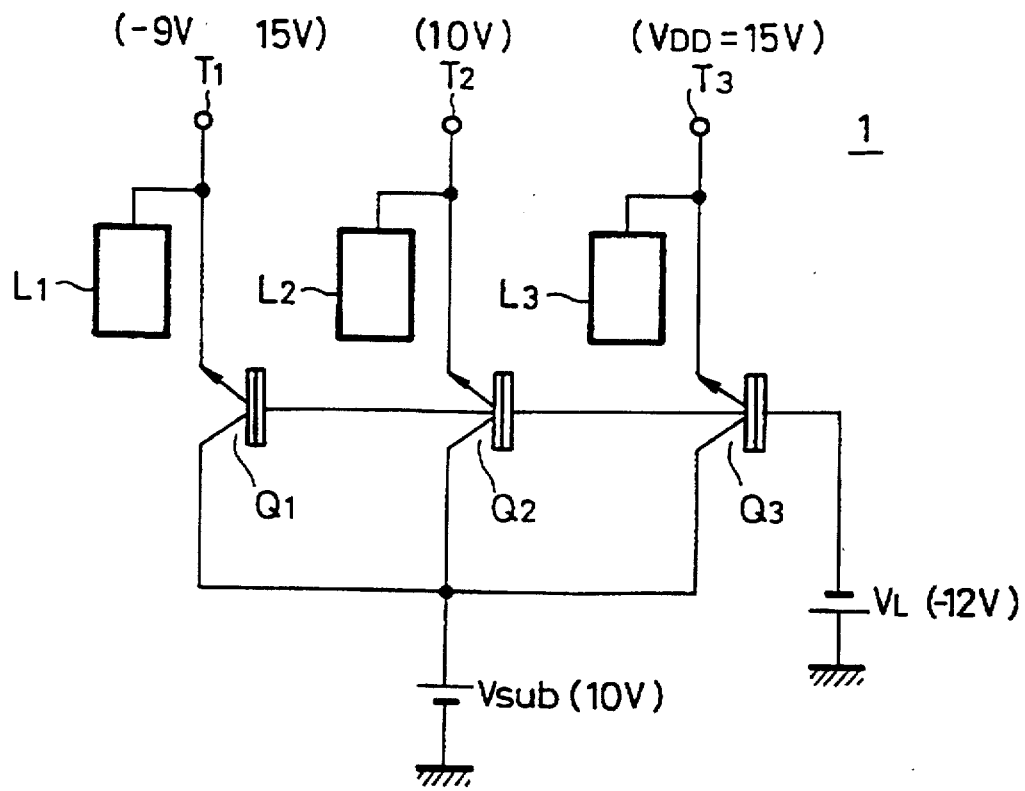
FIG. 1 is a diagram showing an example of a protection circuit.
Figure 2:
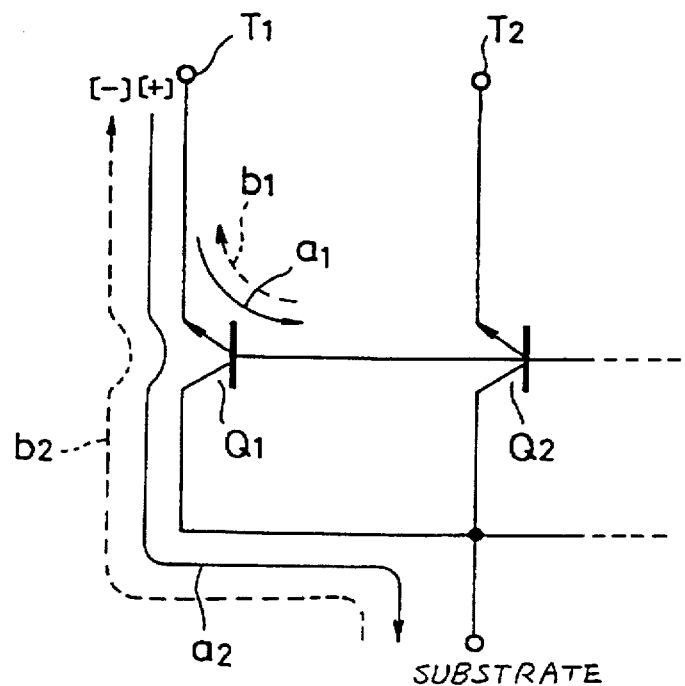
FIG. 2 is a diagram used to explain an operation of the protection circuit shown in FIG. 1.
Figure 3B:
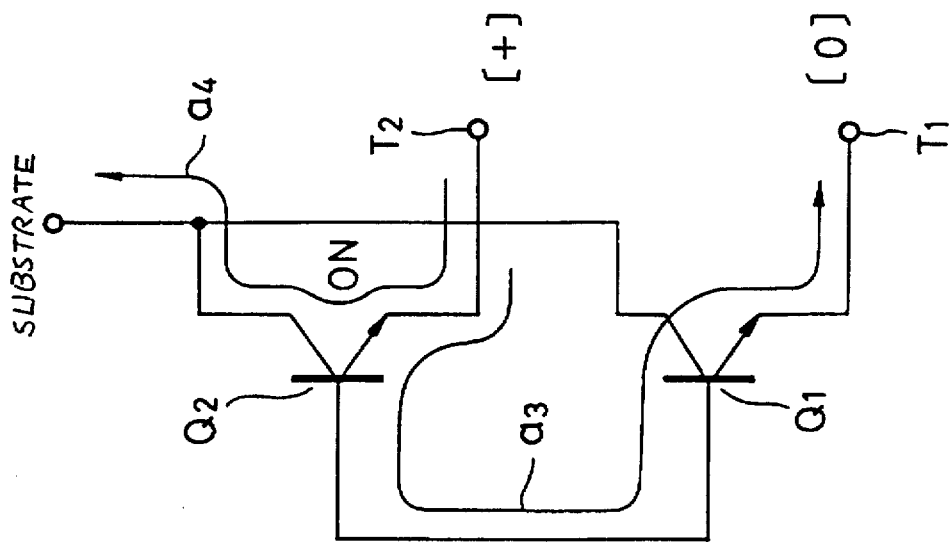
FIGS. 3A and 3B are diagrams used to explain an operation of the protection circuit shown in FIG. 1, respectively.
Figure 3A:
Figure 3A:
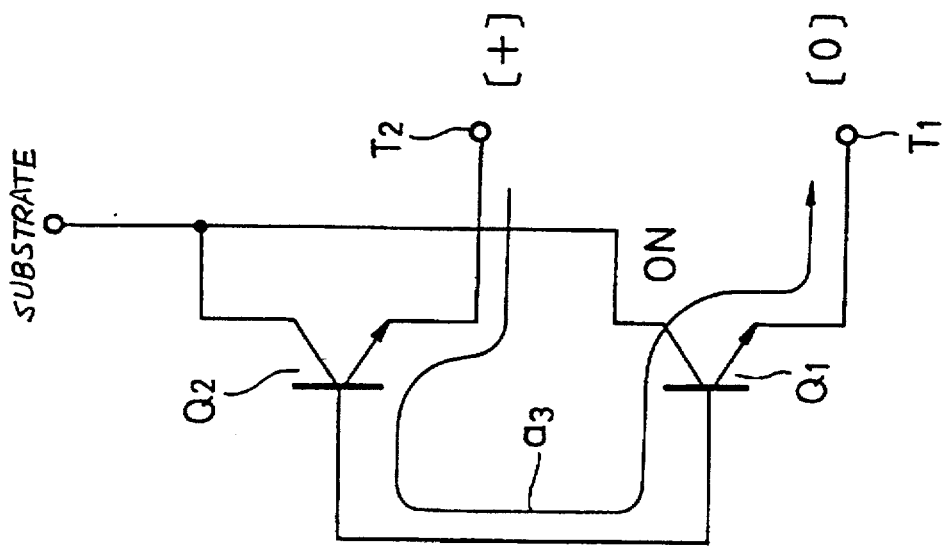
Figure 4B:
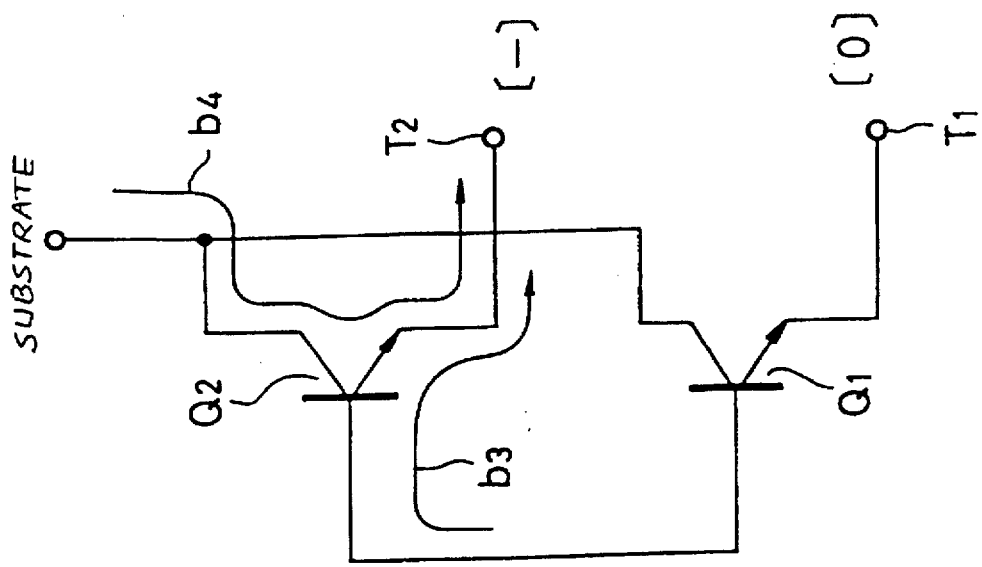
FIGS. 4A and 4B are diagrams used to explain an operation of the protection circuit shown in FIG. 1.
Figure 4A:
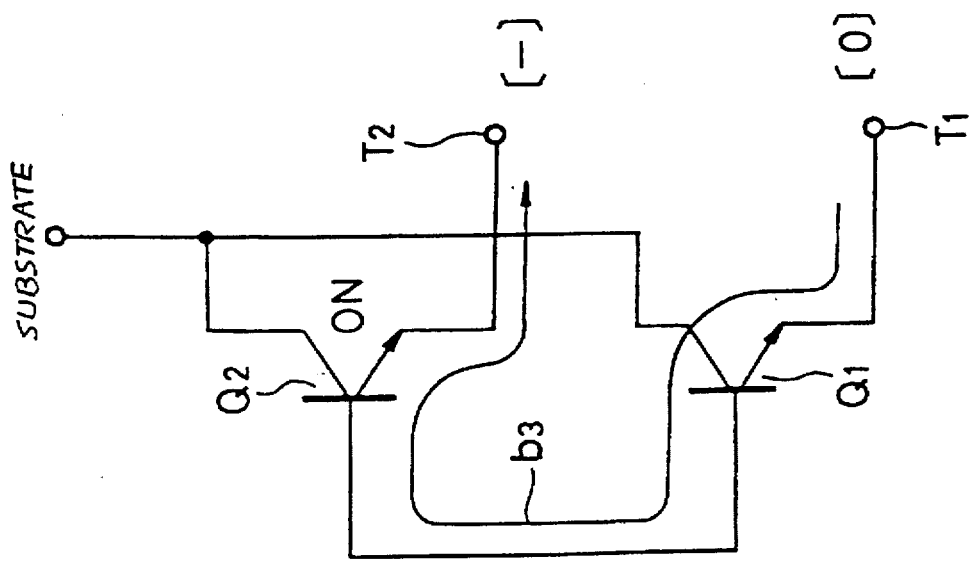
Figure 5:
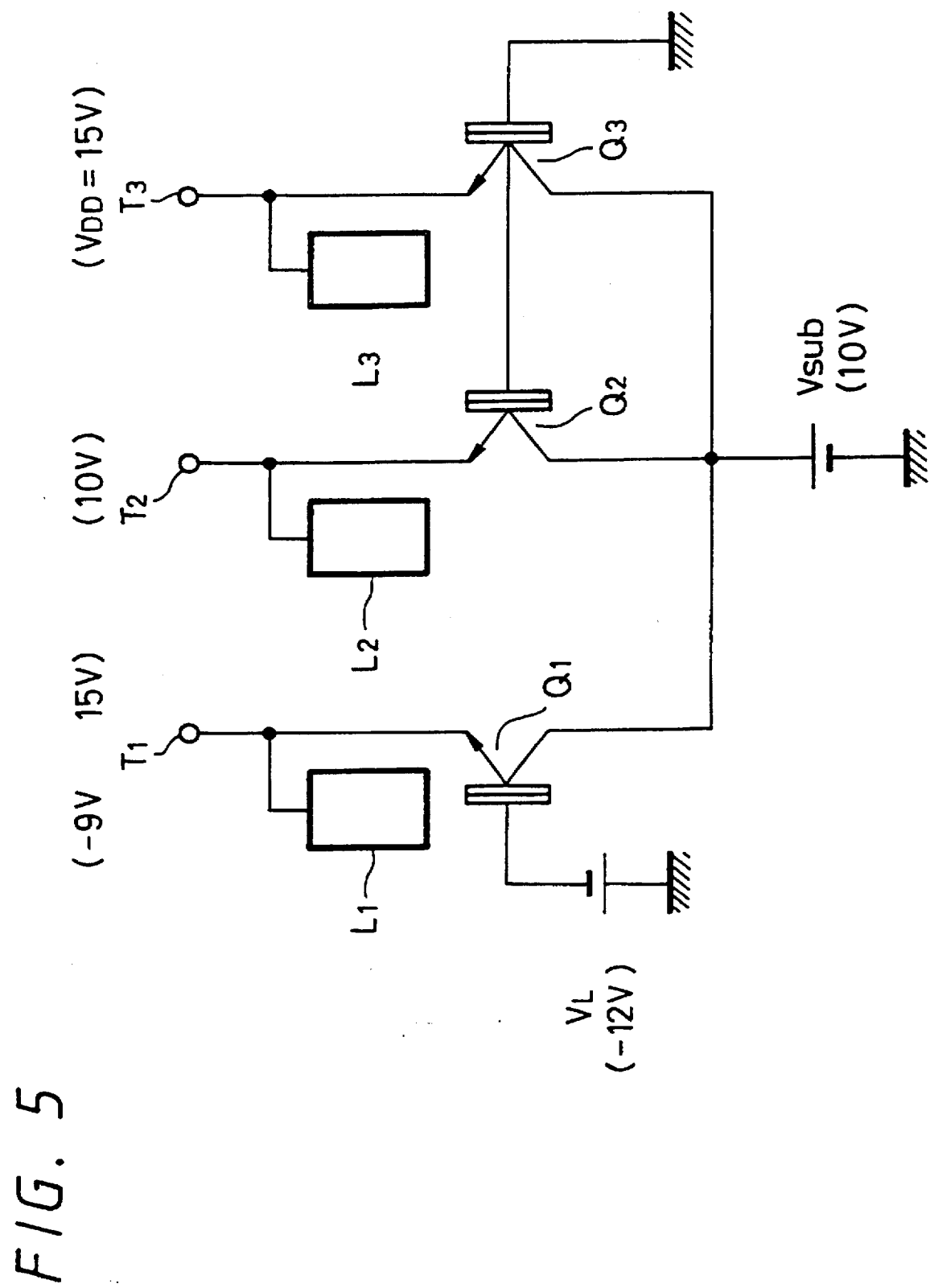
FIG. 5 is a diagram showing another example of a protection circuit.

According to the present invention, since the protection transistors $Q_{11}$, $Q_{12}$, $Q_{13}$ of the first group and the protection transistors $Q_{22}$, $Q_{23}$ of the second group are provided with respect to the terminals, the bases of the protection transistors $Q_{11}$, $Q_{12}$, $Q_{13}$ are connected in common and supplied with the minimum voltage $V_L$ used within the protection circuit and the bases of the protection transistors $Q_{22}$, $Q_{23}$ of the second group are connected to the ground (GND), the base-emitter withstand voltages of the protection transistors $Q_{22}$, $Q_{23}$ of the second group can be set to be lower than those of the example shown in FIG. 1. As a result, it is possible to improve a strength of the protected portions $L_2$, $L_3$ connected to the terminals $T_2$, $T_3$ against a static electricity.

Since all the terminals $T_1$, $T_2$, $T_3$ are connected via the protection transistors ($Q_{11}$, $Q_{12}$, $Q_{13}$) of the first group whose bases are connected in common, a strength against the static electricity applied between the terminals can be held at the same level as that of the example shown in FIG. 1. Therefore, in particular, it is possible to improve a strength against a static electricity applied between the output section, which is easily affected by a static electricity, and the ground (GND), a strength against a static electricity applied between the output section and the substrate and a strength against a static electricity applied between the terminals.

The above-mentioned electrostatic strength is an electrostatic strength including the protection transistors and the protected portions.

In the terminal $T_1$ where the minimum potential used within the protection circuit is negative, the base area of the protection transistor $Q_{11}$ connected to the terminal $T_1$ is larger than the standard base area (e.g., twice as large as the standard base area) and its strength against static electricity is strong inherently. There is then no problem.

While the protection circuit 51 shown in FIG. 10 uses the npn bipolar transistors as the protection transistors $Q_{11}$, $Q_{12}$, $Q_{13}$, $Q_{22}$, $Q_{23}$, the present invention is not limited thereto and the protection transistors $Q_{11}$, $Q_{12}$, $Q_{13}$, $Q_{22}$, $Q_{23}$ may be formed of pnp bipolar transistors. When the protection transistors $Q_{11}$, $Q_{12}$, $Q_{13}$, $Q_{22}$, $Q_{23}$ are formed of the pnp bipolar transistors, the base voltage $V_2$ of the protection transistors $Q_{22}$, $Q_{23}$ of the second group is set to be lower than the base voltage $V_1$ of the protection transistors $Q_{11}$, $Q_{12}$, $Q_{13}$ of the first group. Thus, the protection transistors $Q_{11}$, $Q_{12}$, $Q_{13}$, $Q_{22}$, $Q_{23}$ are operated similarly as described above. Hence, the protected portions can be protected from a static electricity.

Figure 14:
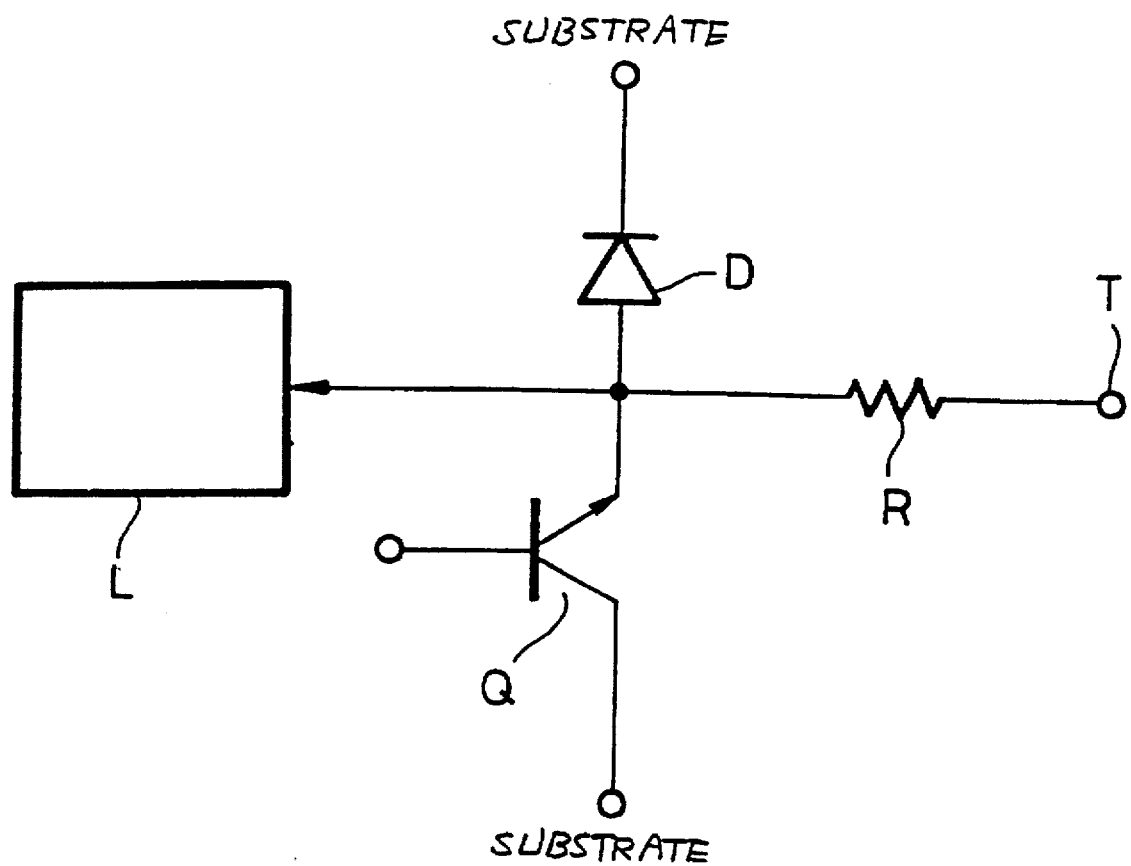
FIG. 14 is a diagram showing a main portion of a modified example of the protection circuit according to the present invention.

As shown in FIG. 14, a protection resistor R and a protection diode D can be connected between the emitter of a protection transistor Q and a terminal T or a substrate. In FIG. 14, the protection resistor R is connected between the emitter of the protection transistor Q and the terminal T, and the protection diode D is connected between the emitter of the protection transistor Q and the substrate. In FIG. 14, reference symbol L denotes a protected portion.

While the protection circuit 51 according to the present invention was applied to a CCD solid-state imager of an interline transfer (IT) type as described above, the protection circuit 51 is not limited thereto and can be applied to a CCD solid-state imager of a frame interline transfer (FIT) type and other semiconductor integrated circuits.

According to the present invention, in a semiconductor device such as a CCD solid-state imager wherein terminals applied with the ground voltage, the positive voltage and the negative voltage are disposed in the mixed state, it is possible to improve the strength against the static electricity applied between the terminal and the ground (GND) and the strength against the static electricity applied between the terminal and the substrate. Also, it is possible to improve the strength against the static electricity applied between the terminals. Therefore, the semiconductor device, e.g., CCD solid-state imager can be made highly reliable.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. An electric circuit comprising:
   a first electrical element operating within a first voltage area and having a first breakdown voltage;
   a second electrical element operating within a second voltage area and having a second breakdown voltage;
   a first terminal connected to said first electrical element;
   a second terminal connected to said second electrical element;
   a first protection circuit connected to said first and second terminals wherein said first protection circuit comprises a first bipolar transistor whose emitter is connected to said first terminal and a second bipolar transistor whose emitter is connected to said second terminal, and wherein bases of said first and second bipolar transistors are connected in common to ground;
   a second protection circuit connected to one of said first and second terminals, wherein said second protection circuit comprises a third bipolar transistor whose emitter is connected to one of said first and second terminals, wherein a base of said third bipolar transistor is electrically isolated from said bases of said first and second bipolar transistors.

2. An electric circuit according to claim 1, wherein said first voltage area is different from said second voltage area.

3. An electric circuit according to claim 1, wherein said first breakdown voltage is different from said second breakdown voltage.

4. An electric circuit according to claim 1, wherein a first voltage is supplied to said bases of said first and second bipolar transistors and a second voltage different from said first voltage is supplied to said base of said third bipolar transistor.

5. An electric circuit according to claim 1, wherein an absolute value of a junction breakdown voltage between an emitter and a base of said first and second bipolar transistors is larger than that of said third bipolar transistor.

6. An electric circuit according to claim 1, wherein each of said first, second and third bipolar transistors comprises an npn transistor and said second voltage is higher than said first voltage.

7. An electric circuit according to claim 1, wherein each of said first, second and third bipolar transistors comprises a pnp transistor and said second voltage is lower than said first voltage.

8. An electric circuit according to claim 1, wherein a negative voltage is applied to the base of said third bipolar transistor.

9. An electric circuit according to claim 1, wherein a minimum voltage, being the lowest voltage applied in said electric circuit, is applied to the base of said third bipolar transistor.

10. An electric circuit comprising:

a plurality of electrical elements in a electric circuit to be protected;

a plurality of terminals associated with said plurality of electrical elements, said plurality of terminals supplied with operating voltages;

a protection circuit for protecting said plurality of terminals, said protection circuit-comprising:

a plurality of first bipolar transistors connected between said plurality of terminals and a first voltage in cascade, bases of said plurality of first bipolar transistors connected in common and supplied with a second voltage; and a second bipolar transistor connected between one of said plurality of terminals and said second voltage, a base of said second bipolar transistor supplied with a third voltage lower than said second voltage.

11. An electric circuit according to claim 10, wherein an absolute value of a junction breakdown voltage between an emitter and a base of said first bipolar transistor is larger than that of said second bipolar transistor.

12. A device comprising:

a plurality of electrical elements in a device to be protected;

a plurality of terminals associated, respectively with said plurality of electrical elements;

a first protection circuit connected to said plurality of terminals for protecting said plurality of electrical elements, said first protection circuit comprising a plurality of first bipolar transistors connected between said plurality of terminals and a first voltage in cascade, bases of said plurality of first bipolar transistors connected in common and supplied with a second voltage; and a second protection circuit connected to two or more of said plurality of terminals, said second protection circuit comprising a plurality of second bipolar transistors connected between said plurality of terminals and said first voltage, bases of said plurality of second bipolar transistors connected in common and supplied with a third voltage different from said second voltage.

13. A device according to claim 12, wherein an absolute value of a junction breakdown voltage between an emitter and a base of one of said first bipolar transistors is larger than that of one of said second bipolar transistors.

14. A device according to claim 12, wherein each of said electrical elements comprises an output circuit.

15. A device according to claim 12, wherein said third voltage is greater than said second voltage.

16. A device according to claim 12, wherein said second voltage is a minimum voltage, being the lowest voltage present in said device.

17. A device according to claim 12, wherein said plurality of second bipolar transistors are each respectively connected in parallel with said first bipolar transistors.

18. An electric circuit comprising:

a first electrical element operating within a first voltage area and having a first breakdown voltage;

a second electrical element operating within a second voltage area and having a second breakdown voltage;

a third electrical element;

a first terminal connected to said first electrical element;

a second terminal connected to said second electrical element;

a third terminal connected to said third electrical element;

a first protection circuit connected to said first and second terminals wherein said first protection circuit comprises a first bipolar transistor whose emitter is connected to said first terminal and a second bipolar transistor whose emitter is connected to said second terminal, and wherein bases of said first and second bipolar transistors are connected in common;

a second protection circuit connected to one of said first and second terminals, wherein said second protection circuit comprises a third bipolar transistor whose emitter is connected to said third terminal, wherein a base of said third bipolar transistor is electrically isolated from said bases of said first and second bipolar transistors.

* * * * *